(12) United States Patent
David

(10) Patent No.: US 6,778,225 B2
(45) Date of Patent: Aug. 17, 2004

(54) TRANSFERRING DATA FROM ONE DEVICE TO ANOTHER

(75) Inventor: Valdo David, Singapore (SG)

(73) Assignee: Koninklijke Philips Electronics N.V., Eindhoven (NL)

( * ) Notice: Subject to any disclaimer, the term of this patent is extended or adjusted under 35 U.S.C. 154(b) by 628 days.

(21) Appl. No.: 09/794,980

(22) Filed: Feb. 28, 2001

(65) Prior Publication Data

US 2001/0029555 A1 Oct. 11, 2001

(30) Foreign Application Priority Data

Mar. 3, 2000 (WO) ..................................... SG00/00034

(51) Int. Cl.$^7$ ................................................ H04N 5/44
(52) U.S. Cl. .................................... 348/734; 348/725
(58) Field of Search ........................ 348/734, 725, 348/570, 722; 341/176, 173, 177; 340/825, 825.22, 825.23, 825.24, 825.72, 825.73, 825.29, 10.52, 5.64; 725/78, 80, 81, 85; H04N 5/44, 5/50, 5/222

(56) References Cited

U.S. PATENT DOCUMENTS

| | | | | |
|---|---|---|---|---|
| 5,208,462 A | * | 5/1993 | O'Connor et al. | 250/493.1 |
| 5,291,325 A | * | 3/1994 | Elliott | 398/106 |
| 5,561,543 A | * | 10/1996 | Ogawa | 348/734 |
| 5,677,895 A | * | 10/1997 | Mankovitz | 348/734 |
| 6,005,490 A | * | 12/1999 | Higashihara | 340/825.72 |
| 6,216,266 B1 | * | 4/2001 | Eastman et al. | 348/570 |
| 6,223,348 B1 | * | 4/2001 | Hayes et al. | 348/734 |
| 6,407,779 B1 | * | 6/2002 | Herz | 348/734 |
| 6,549,719 B2 | * | 4/2003 | Mankovitz | 348/734 |
| 6,668,132 B2 | * | 12/2003 | Wissman | 386/46 |

FOREIGN PATENT DOCUMENTS

| | | | | |
|---|---|---|---|---|
| DE | 3640437 A1 | | 5/2000 | |
| JP | 62039081 A | * | 2/1987 | ........... H01L/33/00 |
| JP | 10303463 A | | 11/1998 | |
| JP | 10340123 A | | 12/1998 | |
| WO | 9744897 | | 5/1996 | |
| WO | 9736421 | | 3/1997 | |

* cited by examiner

Primary Examiner—Sherrie Hsia
(74) Attorney, Agent, or Firm—Edward W. Goodman

(57) ABSTRACT

In a method and arrangement for installing or updating a large number of television receivers in, e.g., hotels, one of the television receivers (1) is manually programmed. The data is then downloaded from the television receiver into a remote control unit (3) by modulating a conventional status LED (17) of the television receiver. In accordance with the invention, the status LED is of a type which emits visible light (171) as well as infrared light (172). The modulated infrared light beam (172) is detected by an infrared detector (34) of the remote control device and stored (35) therein. The data stored in the remote control unit is subsequently uploaded to other television receivers using the conventional infrared channel (33,15).

8 Claims, 2 Drawing Sheets

TRANSFERRING DATA FROM ONE DEVICE TO ANOTHER

BACKGROUND OF THE INVENTION

1. Field of the Invention

The invention relates to a device comprising a memory for storing operational data of said device, and transfer means for transferring said data to an external device. The invention also relates to a method of transferring data from one device to a plurality of further devices.

2. Description of the Related Art

A device and a method as defined in the opening paragraph are disclosed in Patent Abstracts of Japan, Patent Application JP-A-10340123. The method is very useful for installing large numbers of identical devices, such as radio and television receivers, in, e.g., hotels or hospitals. The installation of a radio or television receiver is a cumbersome process. It requires, for example, all receivable channels to be stored in an ordered list, default values to be set for audio volume, picture brightness, etc. The prior-art method requires this operation to be done for only one receiver. The ordered list of channels and other preferences are then "downloaded" from said receiver into a remote control unit. The data is subsequently "uploaded" from said remote control unit to the further receivers.

International Patent Application WO-97/36421 discloses a similar method. Uploading and downloading of the data are herein carried out via a special handheld storage device which is plugged into the television's SCART plug.

International Patent Application WO 97/44897 and German Offenlegungsschrift DE-A-36 40 437 disclose wireless uploading but require the data to be manually entered in the remote control device.

SUMMARY OF THE INVENTION

It is an object of the invention to further improve and economize on the prior-art method. To this end, the device is characterized in that it comprises a light-emitting diode (LED) of a type which emits visible and infrared light, and control means being arranged to selectively control said LED to emit static light indicating device status information represented by said visible light, or modulate the light emitted by said LED with said stored data to transfer said stored data to said external device as a modulated infrared light stream.

The invention is based on the recognition that some LEDs, which are widely used in radio and television receivers for indicating status information such as on/off/standby, may also emit some infrared light. The energy of the emitted infrared light is low but sufficient to transmit data over a small distance. The data can thus be downloaded into an external portable device by holding said device close to the status LED. Once downloaded in the remote control unit, the data can be uploaded to other receivers in a well-known manner. A dedicated infrared light-emitting diode can be dispensed with, and standard provisions of television receivers (status LED and infrared receiver) are used. Not only does this save costs, it also has the advantage that the design of the receiver is not compromised.

An additional advantage of the invention is that stored data can easily be downloaded into an external service diagnostics device.

It is to be noted that Patent Abstracts of Japan, Patent Application JP-A-10303463, discloses a light-emitting source of a type which emits both visible and infrared light. The light source comprises individual LEDs for visible light and infrared light, and an optical guide which combines the two bundles of light.

DESCRIPTION OF PREFERRED EMBODIMENTS

Figure 1:
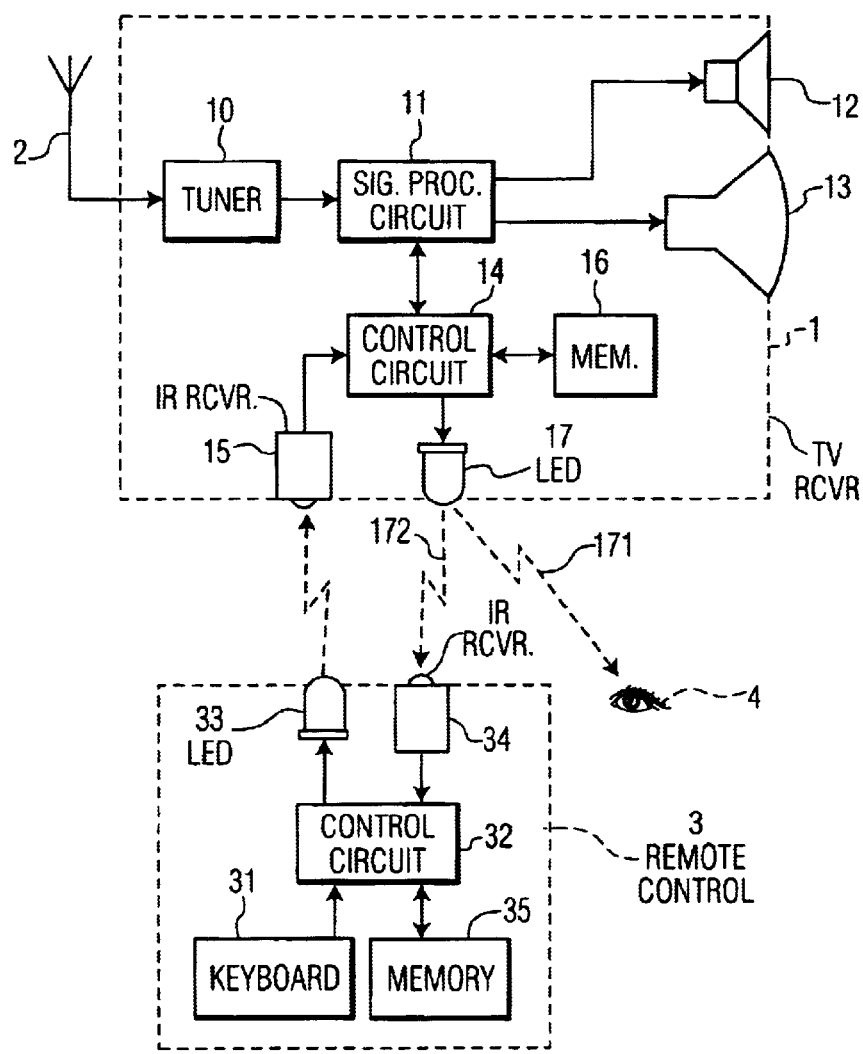
FIG. 1 shows a schematic diagram of a system comprising a device in accordance with the invention.

FIG. 1 shows a television receiver 1 as an embodiment of the device in accordance with the invention. The television receiver 1 is connected to an antenna 2 and comprises a tuner 10, a signal-processing circuit 11, audio speakers 12, a display screen 13, a control circuit (microprocessor) 14, an infrared receiver 15, a memory 16, and a LED 17. Programmable settings, such as, an ordered list of receivable stations, default values for audio volume, picture brightness, etc., are stored in the (non-volatile) memory 16. The television receiver is controllable and programmable via a remote control unit 3. The remote control unit is conventional in the sense that it comprises a keyboard 31, a control circuit 32, and an infrared LED 33. The remote control unit further comprises an infrared receiver 34 and a memory 35.

The receiver's LED 17 is of a type which emits light having wavelengths in both the visible and invisible part of the spectrum. For example, the LED emits visible red light as well as invisible infrared light. The visible component is denoted 171 in FIG. 1 and can be seen by a user 4. The infrared component may be substantially smaller than the red component. This component is denoted 172 in FIG. 1 and detectable by the infrared receiver 34 of remote control unit 3.

Figure 2:
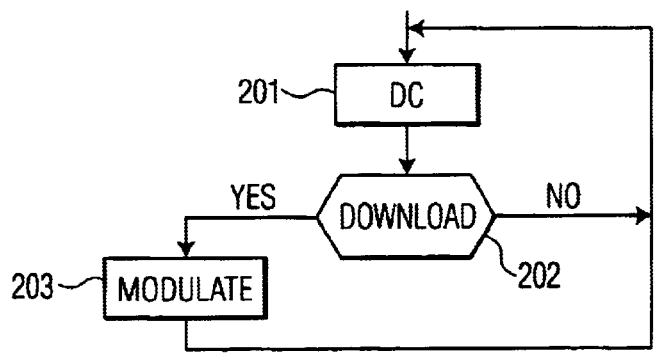
FIGS. 2 and 3 show diagrams to illustrate the operation of a control circuit shown in FIG. 1.

FIG. 2 shows a flowchart of operational steps that are carried out by the control circuit 14. A step 201 denotes a conventional operation mode of the television receiver. In this mode, the control circuit 14 applies a DC voltage to LED 17 so as to provide a visible indication of a status of the television receiver, for example, "on" or "standby". In a step 202, the control circuit determines whether the user has given a special "download" command. In response thereto, a step 203 is carried out in which the control circuit 14 reads the data stored in non-volatile memory 16 and applies a carrier signal modulated with said data to LED 17. A carrier frequency which is conventionally used for infrared data transmission (for example, 36 kHz) can be chosen for this operation. Note that the red component and the infrared components of the light signal are equally modulated. This is an additional advantage of the invention. The reduced average visible light intensity during the download operation indicates that said operation is in progress. After the download operation, the receiver assumes the normal operation mode again.

Figure 3:
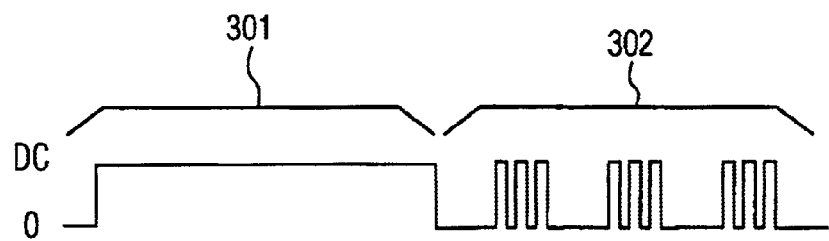

FIG. 3 shows a timing diagram to illustrate the operation of the receiver. Reference numeral 301 denotes the normal operation mode in which a DC voltage is applied to LED 17. Reference numeral 302 denotes the download mode of the receiver in which a modulated carrier is applied to the LED.

The modulated infrared component of the light is received by the infrared light receiver 34 of remote control unit 3. It may be necessary to hold the remote control unit close to the receiver's LED 17. Receiver 34 demodulates the signal from LED 17 into a baseband signal, and control circuit 32 decodes the baseband signal and stores the data in memory 35. The data is thus transferred from the receiver's memory 16 to the remote control unit's memory 35, and can subsequently be "uploaded" to other television receivers.

Figure 4:
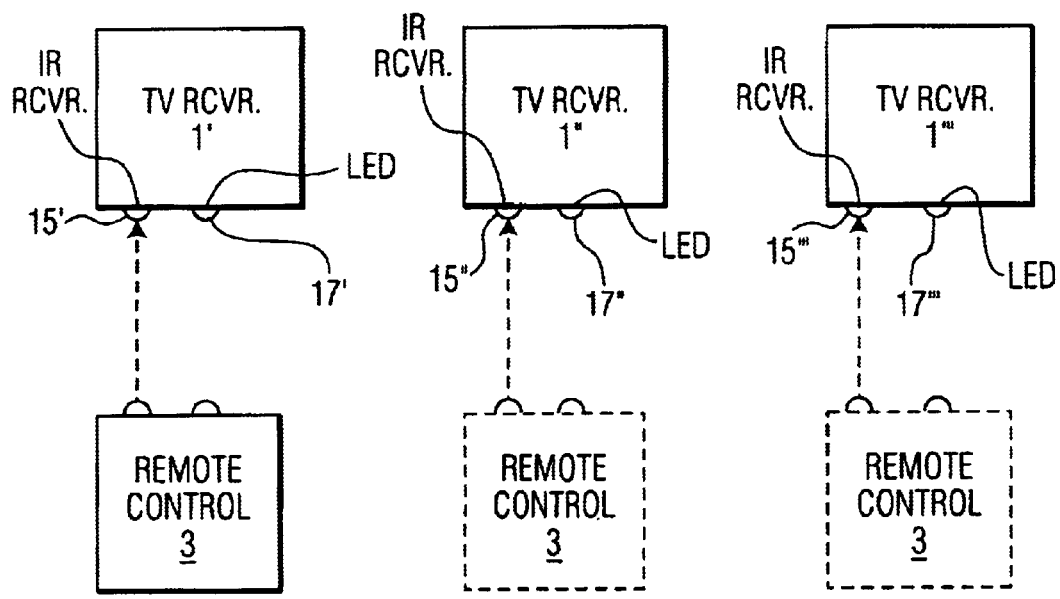
FIG. 4 shows data being uploaded to other television receivers from the remote control device.

A method and arrangement for installing or updating a large number of television receivers in, e.g., hotels is disclosed. One of the television receivers 1 is manually programmed. The data is then downloaded, as shown in FIG. 1, from said television receiver 1 into the remote control unit 3 by modulating the conventional status LED 17 of the television receiver. In accordance with the invention, the status LED is of a type which emits visible light 171 as well as infrared light 172. The modulated infrared light beam 172 is detected by the infrared detector 34 of the remote control unit 3 and stored in the memory 35 therein. As shown in FIG. 4, the data stored in the remote control unit 3 is subsequently uploaded to other television receivers 1', 1" and 1''' using the LED 33 on the remote control unit 3 for communicating, selectively, with the IR receivers 15', 15" and 15''' of the other television receivers 1', 1" and 1''', respectively.

What is claimed is:

1. A device comprising a memory for storing operational data of said device and transfer means for transferring said data to an external device, characterized in that the device comprises a light-emitting diode capable of emitting both visible and infrared light, and control means for selectively controlling said LED to emit a static light indicating device status information represented by said visible light, or to modulate the light emitted by said LED with said stored data to transfer said stored data to said external device as a modulated infrared light stream.

2. The device as claimed in claim 1, wherein said device further comprises means for receiving transferred data from said external device and for storing said transferred data in said memory.

3. The device as claimed in claim 2, wherein said device is a broadcast receiver and said external device is a remote control unit for controlling said broadcast receiver.

4. The device as claimed in claim 3, wherein said data is tuning data representing receivable broadcast transmitters and stored in said memory in response to programming commands received from said remote control unit.

5. A system comprising a broadcast receiver and a remote control unit as defined in claim 3.

6. A method of transferring data stored in a device to an external device, the device comprising a light-emitting diode capable of emitting both visible and infrared light, the method comprising the steps:

controlling said LED to emit static light indicating device status information represented by said visible light ;and modulating a signal applied to the LED thereby modulating the light emitted by said LED with said stored data to transfer said stored data to said external device as a modulated infrared light stream.

7. A method of transferring data stored in a device to a plurality of further devices, said method comprising the steps:

transferring said data to an external device in accordance with the method as claimed in claim 6; and transferring said data from said external device to said plurality of further devices.

8. The method as claimed in claim 7, wherein said device and further devices are broadcast receivers and said external device is a remote control unit for controlling one of said devices.

* * * * *